United States Patent
Wang et al.

(10) Patent No.: US 8,932,940 B2
(45) Date of Patent: Jan. 13, 2015

(54) VERTICAL GROUP III-V NANOWIRES ON SI, HETEROSTRUCTURES, FLEXIBLE ARRAYS AND FABRICATION

(75) Inventors: Deli Wang, San Diego, CA (US); Cesare Soci, Singapore (SG); Xinyu Bao, Mountain View, CA (US); Wei Wei, Pasadena, CA (US); Yi Jing, La Jolla, CA (US); Ke Sun, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 159 days.

(21) Appl. No.: 13/126,381

(22) PCT Filed: Oct. 28, 2009

(86) PCT No.: PCT/US2009/062356
§ 371 (c)(1), (2), (4) Date: Jul. 12, 2011

(87) PCT Pub. No.: WO2010/062644
PCT Pub. Date: Jun. 3, 2010

(65) Prior Publication Data
US 2011/0253982 A1    Oct. 20, 2011

Related U.S. Application Data

(60) Provisional application No. 61/183,726, filed on Jun. 3, 2009, provisional application No. 61/108,979, filed on Oct. 28, 2008.

(51) Int. Cl.
*H01L 21/20* (2006.01)
*H01L 21/02* (2006.01)
(Continued)

(52) U.S. Cl.
CPC ............ *H01L 21/0262* (2013.01); *B82Y 10/00* (2013.01); *H01L 21/02381* (2013.01);
(Continued)

(58) Field of Classification Search
CPC ................ B82Y 40/00; H01L 21/0254; H01L 21/02543; H01L 21/02546; H01L 21/02603; H01L 21/02636; H01L 21/02639; H01L 29/0657; H01L 29/0665; H01L 29/0669; H01L 29/0676; H01L 29/068

USPC .......... 438/478, 938, 758, 967, 974; 977/762, 977/763, 765, 813, 815, 819, 825, 764
See application file for complete search history.

(56) References Cited

U.S. PATENT DOCUMENTS
7,307,271 B2    12/2007    Islam et al.
(Continued)

FOREIGN PATENT DOCUMENTS
KR    10-2006-0105069    10/2006

OTHER PUBLICATIONS
Bakkers, Erik, P.A.M., et. al., "Epitaxial Growth of III-V Nanowires on Group IV Substrates", *MRS Bulletin*, vol. 32, Feb. 2007.
(Continued)

*Primary Examiner* — Jay C Kim
(74) *Attorney, Agent, or Firm* — Greer, Burns & Crain Ltd.

(57) ABSTRACT

Embodiments of the invention provide a method for direct heteroepitaxial growth of vertical III-V semiconductor nanowires on a silicon substrate. The silicon substrate is etched to substantially completely remove native oxide. It is promptly placed in a reaction chamber. The substrate is heated and maintained at a growth temperature. Group III-V precursors are flowed for a growth time. Preferred embodiment vertical Group III-V nanowires on silicon have a core-shell structure, which provides a radial homojunction or heterojunction. A doped nanowire core is surrounded by a shell with complementary doping. Such can provide high optical absorption due to the long optical path in the axial direction of the vertical nanowires, while reducing considerably the distance over which carriers must diffuse before being collected in the radial direction. Alloy composition can also be varied. Radial and axial homojunctions and heterojunctions can be realized. Embodiments provide for flexible Group III-V nanowire structures. An array of Group III-V nanowire structures is embedded in polymer. A fabrication method forms the vertical nanowires on a substrate, e.g., a silicon substrate. Preferably, the nanowires are formed by the preferred methods for fabrication of Group III-V nanowires on silicon. Devices can be formed with core/shell and core/multi-shell nanowires and the devices are released from the substrate upon which the nanowires were formed to create a flexible structure that includes an array of vertical nanowires embedded in polymer.

22 Claims, 9 Drawing Sheets

(51) Int. Cl.
*B82Y 10/00* (2011.01)
*H01L 27/06* (2006.01)
*H01L 29/06* (2006.01)
*H01L 29/20* (2006.01)
*H01L 29/205* (2006.01)
*H01L 29/267* (2006.01)
*H01L 29/778* (2006.01)
*H01L 29/88* (2006.01)
*H01L 31/0352* (2006.01)
*H01L 31/074* (2012.01)
*H01L 33/20* (2010.01)
*H01L 33/08* (2010.01)
*H01L 33/32* (2010.01)

(52) U.S. Cl.
CPC .... *H01L21/02543* (2013.01); *H01L 21/02546* (2013.01); *H01L 21/02549* (2013.01); *H01L 21/02603* (2013.01); *H01L 21/02636* (2013.01); *H01L 27/0605* (2013.01); *H01L 29/0665* (2013.01); *H01L 29/0673* (2013.01); *H01L 29/0676* (2013.01); *H01L 29/068* (2013.01); *H01L 29/20* (2013.01); *H01L 29/205* (2013.01); *H01L 29/267* (2013.01); *H01L 29/7784* (2013.01); *H01L 29/88* (2013.01); *H01L 31/035281* (2013.01); *H01L 31/03529* (2013.01); *H01L 31/074* (2013.01); *H01L 33/20* (2013.01); H01L 21/02573 (2013.01); H01L 33/08 (2013.01); H01L 33/32 (2013.01); *Y02E 10/50* (2013.01); *Y10S 438/938* (2013.01); *Y10S 438/967* (2013.01); *Y10S 438/974* (2013.01); *Y10S 977/762* (2013.01); *Y10S 977/763* (2013.01); *Y10S 977/764* (2013.01); *Y10S 977/765* (2013.01); *Y10S 977/813* (2013.01); *Y10S 977/815* (2013.01); *Y10S 977/819* (2013.01); *Y10S 977/825* (2013.01)
USPC .......... 438/478; 438/758; 438/938; 438/967; 438/974; 977/762; 977/763; 977/764; 977/765; 977/813; 977/815; 977/819; 977/825

(56) References Cited

U.S. PATENT DOCUMENTS

| | | | |
|---|---|---|---|
| 7,521,274 B2* | 4/2009 | Hersee et al. | 438/41 |
| 7,528,002 B2* | 5/2009 | Samuelson et al. | 438/94 |
| 8,183,587 B2* | 5/2012 | Samuelson et al. | 257/98 |
| 8,691,011 B2* | 4/2014 | Samuelson et al. | 117/88 |
| 2006/0125056 A1 | 6/2006 | Samuelson et al. | |
| 2008/0036038 A1 | 2/2008 | Hersee et al. | |
| 2008/0149944 A1 | 6/2008 | Samuelson et al. | |

OTHER PUBLICATIONS

Bao, Xin-Yu, et. A, "Heteroepitaxial Growth of Vertical GaAs Nanowires on Si (111) Substrates by Metal-Organic Chemical Vapor", *Nano Letters*, vol. 8, No. 11, 2008.

Chuang, Linus C., et al., "Critical diameter III-V nanowires on lattice-mismatched substrates", *Applied Physics Letters*, 90, 043115 (2007).

Ertekin, Elif, et. al., "Equilibrium limits of coherency in strained nanowire heterostructures", *Journal of Applied Physics*, 97, 114325 (2005).

Fang, S.F., et. al., "Gallium arsenide and other compound semiconductors on silicon", *J. Appl. Phys.*, 68 (7) Oct. 1, 1990.

Glas, Frank, "Critical dimensions for the plastic relaxation of strained axial heterostructures in free-standing nanowires", *Physical Review B*, 121302(R) (2006).

Jabeen, Fauzia, et. al., "Self-catalyzed growth of GaAs nanowires on cleaved Si by molecular beam epitaxy", *Nanotechnology*, 19 (2009) 275711.

Johansson, Jonas, et. al., "Manipulations of size and density of self-assembled quantum dots grown by MOVPE". *Physica E*, 2 (1998) 667-671.

Mandl, Bernhard, et. al., "Au-Free Epitaxial Growth of InAs Nanowires", *Nano Letters*, vol. 6, No. 8, 2006.

Mattila, M., et. al., "Catalyst-free growth of In(As)P nanowires on silicon", *Applied Physics Letters*, 89, 063119 (2006).

Martensson, Thomas, et. al., "Epitaxial Growth of indium Arsenide Nanowires on Silicon Using Nucleation Templates Formed by Self-Assembled Organic Coatings", *Adv. Mater.*, 2007, 19, 1801-1806.

Martensson, Thomas, et. al., "Epitaxial III-V Nanowires on Silicon", *Nano Letters*, vol. 4, No. 10, 2004.

Tomioka, Katsuhiro, et. al., "Control of InAs Nanowire Growth Directions on Si", *Nano Letters*, vol. 8, No. 10, 2008.

Venables, John A., *Surface Science* 299/300 (1994) 798-817.

Wagner, R.S., et. al., "Vapor-Liquid-Solid Mechanism of Single Crystal Growth", *Applied Physics Letter*, vol. 4, No. 5, Mar. 1, 1964.

Wei, Wei, et. al., "Direct Heteroepitaxy of Vertical InAs Nanowires on Si Substrates for Broad Band Photovoltaics and Photodetection", *Nano Letters*, vol. 9, No. 8, 2009.

* cited by examiner

VERTICAL GROUP III-V NANOWIRES ON SI, HETEROSTRUCTURES, FLEXIBLE ARRAYS AND FABRICATION

REFERENCE TO RELATED APPLICATIONS AND PRIORITY CLAIM

This application claims priority under 35 U.S.C. §119 and all other applicable statutes and treaties from prior U.S. provisional application Ser. No. 61/108,979, filed on Oct. 28, 2008 and from prior U.S. provisional application Ser. No. 61/183,726, filed on Jun. 3, 2009.

STATEMENT OF GOVERNMENT INTEREST

This invention was made with government support under grant no. DE-FG36-08GO018016 awarded by Department of Energy and under grant no. ECS0506902 awarded by the National Science Foundation. The government has certain rights in the invention.

FIELD

A field of the invention is integrated Group III-V (arsenide, phosphide, nitride, heterostructures, homostructures and alloys) and silicon devices and fabrications. Example applications of integrated Group III-V/silicon devices of the invention include nanowire-based solar cells, light-emitting diodes (LEDs), lasers, photodetectors and sensors, field-effect transistors (FETs), spintronic transistors, tunneling transistors, memory and logic devices, electrochemical cells. Example applications of flexible nanowire-polymer structures of the invention include nanowire-based light weight flexible/stretchable solar cells (solar tent, curtain, cloth, etc.), light-emitting diodes (LEDs) and display/lighting, lasers, photodetectors and sensors or artificial retinas.

BACKGROUND

Group III-V compound semiconductors have intrinsically higher mobilities and other properties that are superior to silicon for particular functions, particularly optoelectronic functions as one example. Silicon remains the industry standard for the electronics industry standard, however, because the Group III-V materials are higher cost, involve more complex fabrication and are not as widely available as silicon.

A monolithic combination of Group III-V materials and silicon materials holds promise to provide the advantages of both material systems. Accordingly, research has turned toward the monolithic integration of Group III-V semiconductors with silicon. The different material systems have incompatibilities that make the integration less than straightforward.

Lattice and thermal expansion mismatch between the Group III-V semiconductors and silicon is one hurdle to overcome in the monolithic integration of the two material systems. Vertical structures address this difficulty by minimizing that contact area between the materials. A vertical Group III-V nanowire formed on a silicon layer, for example, has a very small contact area as compared to a planar integration typical in semiconductor fabrications where planar layers successively formed and patterned. The small contact area of a vertical structure minimizes the lattice and thermal expansion mismatch inherent to the different material systems.

Achieving the goal of forming vertical Group III-V structures on silicon has generally been accomplished with catalysts. Typically, a metal catalyst is used. For example, Au-catalyzed III-V nanowire growth on silicon via the vapor-liquid-solid mechanism has been proposed for Group III-V vertical nanowire growth on silicon. See, e.g., Martensson, T.; Svensson, C. P. T.; Wacaser, B. A.; Larsson, M. W.; Seifert, W.; Deppert, K.; Gustafsson, A.; Wallenberg, L. R.; and Samuelson, L., "Epitaxial III-V Nanowires on Silicon," Nano Letters, 2004. 4(10): p. 1987-1990; Bakkers, E. P. A. M.; Borgstrom, M. T.; and Verheijen, M. A., "Epitaxial Growth of III-V Nanowires on Group IV Substrates," Mrs Bulletin, 2007. 32(2): p. 117-122; Bao, X.-Y.; Soci, C.; Susac, D.; Bratvold, J.; Aplin, D. P. R.; Wei, W.; Chen, C.-Y.; Dayeh, S. A.; Kavanagh, K. L.; and Wang, D., "Heteroepitaxial Growth of Vertical GaAs Nanowires on Si (111) Substrates by Metal-Organic Chemical Vapor Deposition,". Nano Lett., 2008. 8(11): p. 3755-3760 The nanowires formed by the Au catalyzed method exhibit large islands at their base. The Au is also known to incorporated into the nanowire itself. The presence of Au additionally can cause unwanted deep level traps in the silicon layer upon which the nanowires are formed.

A recently proposed method is growth with a self-assembled organic coating or $SiO_2$ template mask. See, Tomioka, K.; Motohisa, J.; Hara, S.; and Fukui, T., "Control of InAs Nanowire Growth Directions on Si," Nano Letters, 2008. 8(10): p. 3475-3480. This method requires an extra material coating and high temperature baking steps. Self-catalyzed growth of III-V nanowires on silicon is a simpler technique, but reported methods do not provide control over the orientation of the nanowires that form. See, Mattila, M.; Hakkarainen, T.; Lipsanen, H.; Jiang, H.; and Kauppinen, E. I., "Catalyst-Free Growth of In(As)P Nanowires on Silicon," Applied Physics Letters, 2006. 89(6): p. 3; Jabeen, F.; Grillo, V.; Rubini, S.; and Martelli, F., "Self-catalyzed growth of GaAs nanowires on cleaved Si by molecular beam epitaxy," Nanotechnology, 2008. 19(27): p. 275711.

SUMMARY OF THE INVENTION

Embodiments of the invention provide a method for direct heteroepitaxial growth of vertical III-V semiconductor nanowires on a silicon substrate. The silicon substrate is etched to substantially completely remove native oxide. It is promptly placed in a reaction chamber. The substrate is heated and maintained at a growth temperature. Group III-V precursors are flowed for a growth time. A vertical nanowire structure of the invention is an array of non-tapered Group III-V nanowires directly contacting a silicon substrate having substantially no non-vertical nanowires. Preferred embodiment vertical Group III-V nanowires on silicon have a core-shell structure, which provides a radial homojunction or heterojunction. A doped nanowire core is surrounded by a shell with complementary doping. Doping of the nanowire core and shell can be realized in-situ during respective growth of the core and shell. Alloy composition can also be varied. Radial and axial homojunctions and heterojunctions can be realized. Such can provide high optical absorption due to the long optical path in the axial direction of the vertical nanowires, while reducing considerably the distance over which carriers must diffuse before being collected in the radial direction.

Embodiments provide for flexible Group III-V nanowire structures. An array of Group III-V nanowire structures is embedded in polymer. A fabrication method forms the vertical nanowires on a substrate, e.g., a silicon substrate. Preferably, the nanowires are formed by the preferred methods for fabrication of Group III-V nanowires on silicon. Devices can be formed with core/shell and core/multi-shell nanowires and the devices are released from the substrate upon which the nanowires were formed to create a flexible structure that includes an array of vertical nanowires embedded in polymer.

DETAILED DESCRIPTION OF THE PREFERRED EMBODIMENTS

Figure 1:
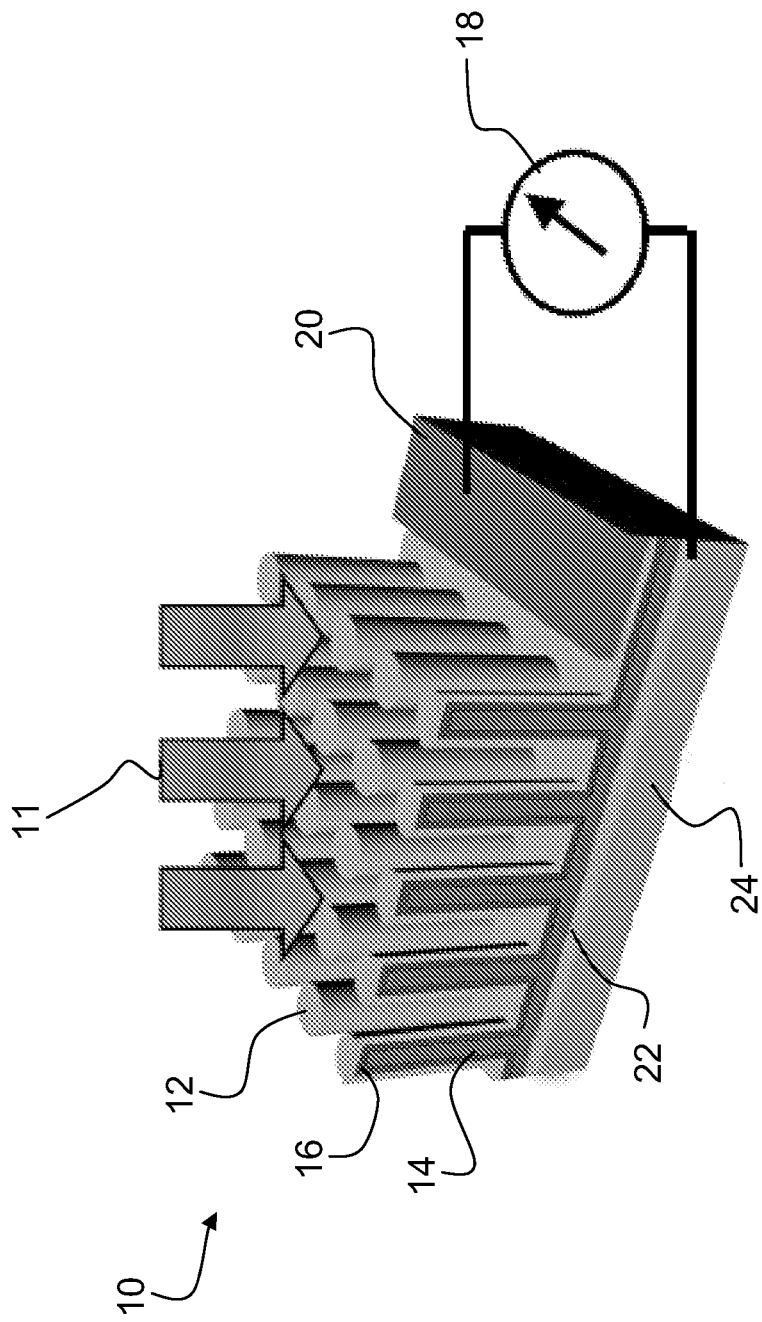
FIG. 1 is a schematic partial cross section and perspective view of a core-shell, radial p-n junction vertical nanowire photovoltaic cell of the invention.

Embodiments of the invention provide for the direct epitaxial ground of Group III-V semiconductors on silicon with fewer processing steps than typical past methods, which keeps the silicon relatively uncontaminated but consistently produces vertical nanowire growth. Preferred methods of the invention provide vertical epitaxial growth of III-V nanowires on a silicon substrate over a large area using Metal-Organic Chemical Vapor Deposition (MOCVD). No pre-deposited material (e.g., metal catalyst, oxide template) is required to accomplish the nanowire growth in accordance with the invention, which significantly simplifies the growth process and eliminates undesirable effects associated with such steps. The invention provides reliable methods that are the basis for low-cost, high-volume fabrication. Methods of the invention allow direct integration of functional III-V-nanowire structures into Si-based microelectronics/photonics. This enables fabrication of devices that combine underexploited III-V semiconductor capabilities with mature silicon technology.

Semiconductor nanowires of the invention have many applications. Semiconductor nanowires are building blocks for various electronic and photonic devices, including field-effect transistors, nanolasers, light-emitting diodes, photodetectors and energy harvesting devices. Vertically aligned semiconductor nanowire arrays are of particular interest for optoelectronic devices such as photovoltaic cells and photodetectors due to their potential to high efficiency because of the enhanced light absorption, improved carrier collection efficiency, reduced optical reflectance, and elongated diffusion length and lifetime for minority carriers compared to conventional thin film devices. Vertically aligned nanowire arrays provide confinement of photons, allowing high efficiency light emitting diodes, waveguiding and lasing. Vertically aligned nanowire arrays electrical carrier confinement and high carrier mobility, enabling high speed transistor devices and circuits.

Preferred embodiment vertical Group III-V nanowires on silicon have a core-shell structure, which provides a radial homojunction or heterojunction. A doped nanowire core is surrounded by a shell or multiple shells with complementary doping and/or a shell or multiple shells with different alloy compositions. Such can provide high optical absorption due to the long optical path in the axial direction of the vertical nanowires and the light concentration due to the contrast in the refractive indices of the nanowire materials with surrounding dielectric materials, while reducing considerably the distance over which carriers must diffuse before being collected in the radial direction. Additionally or alternatively, alloy composition can be varied in the axial direction in the core or any of the shell layers. The core shell structures can also provide photon confinements and waveguiding along the nanowires, which can amplify the optical power allowing lasing action. Such structures can also provide electron/hole confinement and high carrier mobilities, which can form 2D free electron gases in 1D cylindrical geometry.

Embodiments of the invention provide a photodiode configuration with heterojunctions formed by direct integration of vertically aligned nanowire arrays on a silicon substrate. Tuning the alloy composition of III-V compound nanowires permits the bandgap of the heterojunction photodiodes to be tuned, which enables broadband photovoltaic cells and photodetectors, as well as opens up opportunities for direct integration of broad band photodetectors into CMOS technology. Moreover, the high quality heteroepitaxy of III-V nanowires on Si substrates enables the experimental study of fundamental properties (such as band structure, and current transport) of III-V/Si heterojunctions otherwise not readily available.

Embodiments of the invention provide photovoltaic devices, and methods to fabricate photovoltaic devices. In the photovoltaic devices, semiconductor nanowires with heterojunction photodiode structures achieve significant device performance gains, e.g., >50% energy conversion efficiency and UV to IR spectral response. In a preferred embodiment, the heterojunctions use a coaxial or core-shell configuration, i.e., a doped nanowire core surrounded by a shell of complementary doping, with tandem solar cells structures or with multiple quantum wells and superlattice structures being incorporated between the p-type and n-type regions in certain embodiments. This geometry enables high optical absorption along the long axis of the nanowires while considerably reducing carrier collection distance in the radial direction. In another embodiment, the heterojunctions are formed by direct epitaxial growth of vertically aligned III-V semiconductor nanowire arrays on their substrate, particularly on Si wafer which allows integration of functional III-V-nanowire structures (active devices or energy sources) with CMOS technology. The heterojunction bandstructure therein can be engineered by tuning the III-V alloy composition of the nanowires. For example, heterojunction photodiode devices formed by InAs nanowire arrays on Si substrate have been operated in photovoltaic mode and found to exhibit a visible-to-infrared photocurrent excitation profile. Further, for the combined advantages of enhanced energy conversion and broad spectral response, the invention provides devices with core/shell, core/multi-shell or axial heterostructures, e.g., n-InP/(AlInGaP/InP)n/p-InP, fabricated from nanowire arrays grown epitaxially on Si substrate. Preferred fabrication methods include embedding the nanowire arrays in polymer matrices (PI, PMGI, spin-on-glass, PDMS, etc) and application of transparent conductors (ITO, ZnO, NiO, etc) as top electrical contacts. In other embodiments, nanowire semiconductor devices are implemented as high efficiency light emitting diode or nanolasers that serve light sources for Si photonics or intrachip optical communication. In other embodiments, nanowire semiconductor devices are implemented as high efficiency photoelectrochemical cells to break down water and $CO_2$ (for hydrogen generation and $CO_2$ conversion to fuel, respectively).

Embodiments of the invention provide flexible polymer-Group III-V nanowire structures. A formation method of the invention forms a vertical nanowire array on a silicon substrate. Polymer is spun on to surround the nanowires. Tips of the nanowires can extend beyond the polymer, and electrodes, such as transparent electrodes can contact the nanowires. The silicon substrate is released from the nanowires to leave a flexible polymer-nanowire structures. Such flexible polymer-nanowire structures have example applications including nanowire-based light weight flexible/stretchable solar cells (solar tent, curtain, cloth, etc.), light-emitting diodes (LEDs) and display/lighting, lasers, photodetectors and sensors or artificial retinas.

Embodiments of the invention provide nanowire photoelectrochemical cells that can directly dissociate water into hydrogen and oxygen. The nanowire arrays allows improved light absorption efficiency, reduced angular dependence, improved electron/hole separation efficiency, separated electron and hole pathway for collection to provide increased charge collection efficiency compared to planar designs. Other benefits compared to planar designs include separated light absorption and charge transport pathway and reduced charge recombination, enhanced catalytic efficiency, improved surface area, and enhanced gas effusion efficiency, etc. Preferred embodiments have a superlattice of multiple quantum well structures in nanowire core/shell/shell structures, which enhances light absorption and solar harvesting to also improve the water splitting efficiency of the cells. Example materials for a core/shell/shell quantum well structure include n-GaAs/i-GaAs/p-GaAs. Photoelectrochemical cells of the invention have application in the hydrogen industry, hydrogen automobiles, and fuel cells, for example.

In other embodiments, core-shell nanowire semiconductor devices are implemented as high electron mobility transistors (HEMT). The formation of a nanowire heterostructure along the co-axial direction (radial direction) with a delta-doping layer or interface piezoelectrical effect leads to the formation of 2D free electron gas in the 1D cylindrical geometry by separating dopants with the free carriers. The bottom contacts are directly integrated to Si CMOS and top and gate contacts are fabricated by lithographical patterning and deposition.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

An example method of the invention prepares a silicon substrate to remove native $SiO_2$. This can be accomplished by etching with a buffered oxide etcher such as HF. The etching is conducted to completely or substantially completely remove native $SiO_2$ on the surface of the silicon substrate. The etching process with HF is self-limiting as HF will not etch Silicon but will etch the native $SiO_2$. In preferred embodiments, the silicon substrate is a Si(111) wafer. After completion of the etching, the silicon substrate is rinsed to remove any reside of the etching process, and then is dried. DI (de-ionized) water rinsing and $N_2$ drying are preferred for these steps. The silicon substrate is then promptly placed into a reaction chamber prior to any substantial re-oxidation of the silicon surface. The etching removes the native oxide and forms a hydrogen terminated clean surface. This provides the atomic clean surface during the growth for island nucleation. Unetched or reformed oxides compete with the nucleation center that is necessary to foam non-vertical nanowire growth.

The substrate is heated to a growth temperature and a state of thermal equilibrium. For example, the substrate is heated to 500-750° C. or directly heated to and maintained at a growth temperature (400-650C). Group III-V nanowire growth is then conducted. Specifically, Group III-V precursors are introduced with carrier gas into the reaction chamber having the silicon substrate to establish a total flow rate of the Group III-V precursors, each with a respectively chosen molar fraction. The reaction chamber is kept at a substantially constant chamber pressure during growth. Vertical nanowires form during growth, which is allowed to proceed for a predetermined growth time. The length of time determines the length of nanowires formed. The length of nanowire is proportional to the growth time. Nanowires continue to form to a length beyond which is typically useful. The minimum growth time is the nucleation time which the materials gather together before the nanowire can grow (usually a few seconds or less).

The Group III precursor flow is then stopped while the flow of the Group V precursor is maintained for a period while the reactor cools. In experiments, InAs were formed. Other III-V nanowires, e.g., $Al_xIn_yGa_{(1-x-y)}As_zP_{(1-z)}$ allowed, can be grown by the same method. Other preferred nanowires of the invention are GaAs nanowires, and preferred methods of the invention form GaAs nanowires directly on silicon. A preferred temperature range for growth is about 350 C to 750 C.

Preferably, the reactor includes a temperature-controlled holder for mounting a silicon substrate in thermal contact with the holder and a showerhead located in the vicinity of the substrate holder. Preferred precursors are $AsH_3$ (arsine) and TMI (trimethyl-indium-$(CH_3)_3$In), a preferred carrier gas is $H_2$, and a preferred substrate is a (111) oriented Si wafer. The reactor is preferably a Metal-Organic Chemical Vapor Deposition (MOCVD) system equipped with a showerhead that is a Close-Coupled Showerhead. Preferably, before loading into the reactor chamber, the Si substrate is subject to treatment comprising consecutively: etching using diluted Buffered Oxide Etch (BOE:$H_2O$=6:1) for 30 seconds to remove the native oxide; rinsing in DI water for about 15 seconds; and drying by $N_2$ blow-drying. Preferably, the total flow rate is 20 liters/min, the $AsH_3$ and TMI molar fractions are $2\times10^{-4}$ and $2\times10^{-6}$, respectively; and the chamber pressure 100 Torr. Preferably, the growth temperature is in the range of about 400-650° C., the growth time is about 5 minutes and the cool-down temperature is about 250° C. Preferred embodiment vertical Group III-V nanowires on silicon have a uniform structure (such as InAs) or are doped with dilute magnetic metal, such as Mn, Co, Fe, Ni. Such doping can provide spin transport, injection, detection for spintronics (spin transistors, light emitting diodes, photodetectors, memory and logic).

The doping and/or alloy composition can also be varied in the axial direction during formation of the nanowire itself or one or more shell layers. Preferred embodiment vertical Group III-V nanowires on silicon have an axial segmental structure, which provides a axial homojunction or heterojunction. Variation of complementary doping and alloy composition along the axial direction can be constructred in a way to allow carrier (electron/hole) tunneling along the axial junction (tunneling field effect transistors, memory and logic).

The homojunction and heterojunction structures and small dimension of semiconductor nanowires allow additional lattice strain relax and facilitate high quality and sharp interfaces. By varying the alloy composition, a tunneling junction is formed along the nanowire axial direction and the tunneling barrier is modified by the surrounded gate. Examples of this preferred embodiment vertical nanowire heterostructures are InAs/GaSb, InGaAs/GaSb/InGaAs, and InGaAs/AlGaSb/InGaAs. Preferred embodiments have a very narrow (Al)GaSb segment, defined during growth. Preferred embodiment vertical nanowire tunneling transistors allow high speed device, circuit, and computing/logic, low voltage and low power consumption, direct integration to CMOS, and high density integration to Si.

After completion of the initial Group III-V nanowires, core-shell structures can be formed by normal Group III-V growth to form a layer or multiple layer coatings on the nanowires that were formed directly upon the silicon substrate. In methods of the invention growth of nanowires of a first Group III-V material (e.g., InAs) is first conducted and then the nanowires are consequently coated of another Group III-V material layer of a different material or a different doping Doping is achieved in-situ during growth of the nanowire core or any subsequent layers that form shell layers. In-situ doping can be accomplished for example, p-type doping realized using in-situ doping during the growth by flowing Zn or Mg sources. The subsequent layer or layers grown after the nanowire form a shell or shell around the core that is the nanowire. Example embodiments layer $Al_xIn_yGa_{(1-x-y)}As_zP_{(1-z)}$ shell and shells which are intrinsic, p-doped (Zn), or n-doped (Si), along the radial direction or axial direction of nanowire growth orientation. Such core-shell nanowires have applications including but not limited, light emitting diodes, lasers, biosensors, photodetectors, transistors, electron emitters, solar cells, etc.

FIG. 1 is a schematic partial cross section and perspective view of a core-shell, radial p-n junction vertical nanowire photovoltaic cell 10 of the invention. Light 11 is incident on the top surface of the cell, which is a transparent electrode coating 12, e.g., indium tin oxide (ITO). N-type vertical nanowires 14 form cores and a p-type shell 16 forms a p-n junction. Metal contacts are put separately on p- and n-type materials. Additional shell layers can be used to incorporate multiple quantum well and superlattice structures between the p-type and n-type regions of a p/n or p-i-n core/shell or core/multi-shell junctions (which promise enhanced light absorption of sub-bandgap photons without losing the $V_{oc}$, and being predicted theoretically of energy conversion efficiencies in excess of 60% for the have intermediate band solar cells). A sensor 18, for example, can provide photodetection or the cell can be used to convert light into electrical energy. A top contact 20 and bottom electrode 22 (part of silicon substrate 24) are illustrated as being formed on a silicon substrate 24. The Si substrate 24 is n-type, so the p-type shell 16 will form a p-n junction blocking the majority electrons from the electrode 22/substrate 24 to shell. The Si 24 acts as the bottom electrode. During the growth, the n-type III-V material 14 will also coat on the Si substrate as a poor quality film, but the silicon substrate 24 is used as the bottom electrode 22.

The core-shell structure can provide a radial homojunction or heterojunction. A doped nanowire core is surrounded by a shell or multiple shell with complementary doping, or a nanowire core and a/multiple shells consist of alloy III-V semiconductors with different compositions. Such structures can provide for the separation of carriers (electron or holes) from the dopants or piezoelectric interface of the heterojunction, which lead to high carrier mobilities (field effect transistors and HEMT—high electron mobility transistors, memory and logic). The core-shell structure with a radial homojunction or heterojunction has a doped nanowire core that is surrounded by a shell or multiple shells with complementary doping, or a nanowire core and a/multiple shells consist of alloy III-V semiconductor with different compositions. Such heterojunction and homojunction nanowire structures can provide high optical absorption due to the long optical path in the axial direction of the vertical nanowires, while reducing considerably the distance over which carriers must diffuse before being collected in the radial direction, which enables high efficiency light detection (photodetectors and arrays) and light to electricity conversion/collection (solar cells). Such can also provide large surface area for catalytic reaction, while having small surface curvature from which solid surface gas desorption is increased (photoelectrochemical cells). Such can also provide waveguiding of light inside the semiconductor gain media (light emitting diodes or laser diodes).

In core-shell nanowires specifically for a solar cell, the axial and radial heterostructures 14, 16 can be in tandem cell or superlattice structures. In a particular device fabrication, the nanowire arrays are embedded in polymer matrices, such as PI, PMGI, SOG (spin-on-glass), PDMS, etc. The polymers are formed such as by spin-coating after nanowire and shell growth. After formation of the polymer to embed the nanowires, photolithography, etching, and deposition steps are conducted to form top electrical contacts. The top contacts are preferably formed of transparent conductors, such as ITO, ZnO, NiO, etc. After formation of the top contacts, the silicon substrate can also be released/removed to leave a preferred flexible nanowire-polymer structure that also has many applications as discussed above.

Nanowire and polymer structures of the invention are the basis for flexible/stretchable light weight electronic and optoelectronic devices. Fabrication is achieved by transferring vertical semiconductor nanowires into polymers, such as polyimide (PI, PMGI), polysilicone (PDMS—polydimethoxysilane), PMMA (polymethyl methacrylate), etc. In a preferred method of fabrication, vertical nanowires are grown using MOCVD. Preferably, the nanowires are fabricated as described above directly on a silicon substrate. However, other methods of fabrication on other substrates can also be used.

After the formation of vertical nanowires in a desired device structure (solar cells, photodetectors, or light emitting diodes, etc.), the nanowires are embedded in a thin layer of polymer, e.g., a few microns thick depending on the height of nanowires. To aid release a sacrificial layer of water soluble polymer may be applied prior to the polymer embedding layer. The polymer layer can be formed to leaving a small nanowire tip to be exposed. Nanowire tips can also be exposed by etching methods. Metal contacts to the nanowires (and nanowire shell(s) can be made via deposition or lithographical definition of patterns followed by metal deposition. Subsequent to the formation of device contact layers, which can form circuit interconnect patterns, for example, a thicker polymer layer can be formed as a protective or handling layer e.g., on the order of zero to a few ten/hundred/thousand microns).

The substrate, e.g., Si substrate on which the vertical nanowires were original formed is released such as by peeling the polymer/nanowire composite off. This exposes the backside of the polymer structure for formation of device contacts, etc. For example, transparent or semitransparent electrode contacts can be formed on the backside. Example materials include ITO, ZnO, NiO, etc. transparent conducting oxides or very thin metal layers. The electrodes on the top and back side can be patterned array/stripes, in a crossbar geometry or in complex circuit interconnect patterns. The nanowire devices embedded in the flexible polymer can form pixels, for example, for LED arrays/displays, photodetection arrays/image sensor and artificial retinas, for example.

Artisans will recognize many additional applications of the invention and the preferred embodiments. The nanowire arrays, core/shell/multi-shell wires, and radial and homojunction nanowires provide the basic structure for many additional applications of the invention. Example applications include vertical transistors, surrounding gate transistors, core/shell nanowire high electron mobility transistors, axial heterostructure tunneling transistors, vertical nanowire light emitting diodes, for general lighting, or if patterned, for display, vertical nanowirelasers, for bios sensing, micro-projector, etc. Vertical nanowire photodetector array, and if patterned, for image sensing Nanowire device embedding and transfer fabrication (different layers) for making flexible/stretchable light weight devices, Flexible light weight solar cells, for cloth, curtain, tent, umbrella, bags, roof, etc. Flexible, light weight photodetectors, if patterned, for imaging, sensing, artificial retina, medical imaging, etc Flexible light weight LEDs for display (patterned), lighting, decoration, etc.

Experimental Nanowires

Figure 2A:
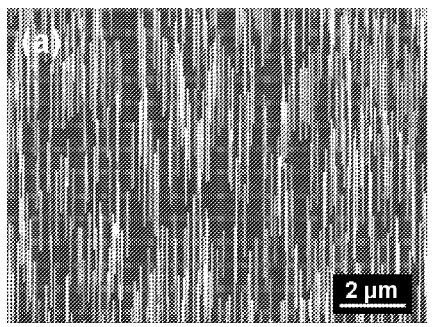
FIGS. 2A-2B are SEM images of InAs vertical semiconductor nanowires of the invention.
Figure 2B:
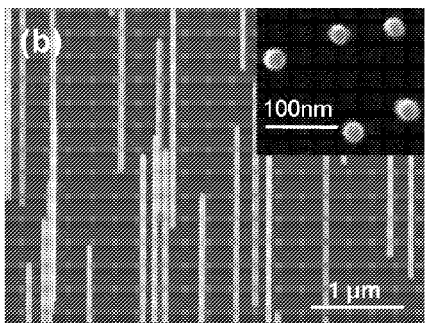
Figure 2C:
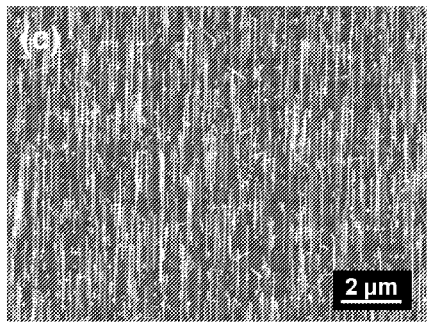
FIGS. 2C and 2D are SEM images of InAs nanowires (45° view angle) grown silicon substrates after etching followed by re-oxidization for 24 hours and 130 hours, respectively.
Figure 2D:
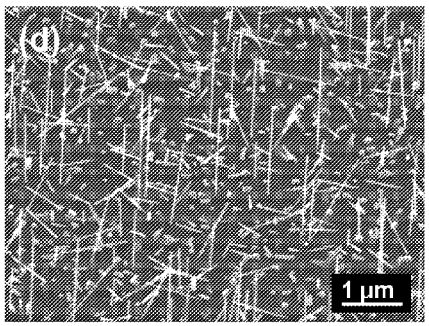
Figure 2F:
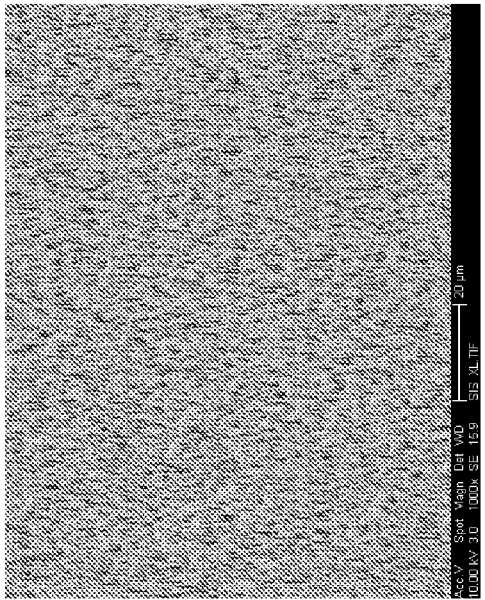
FIGS. 2E-H are SEM images of InAs/InGaAs/GaAs/InGaP core/multi-shell nanowires grown on silicon substrates.
Figure 2H:
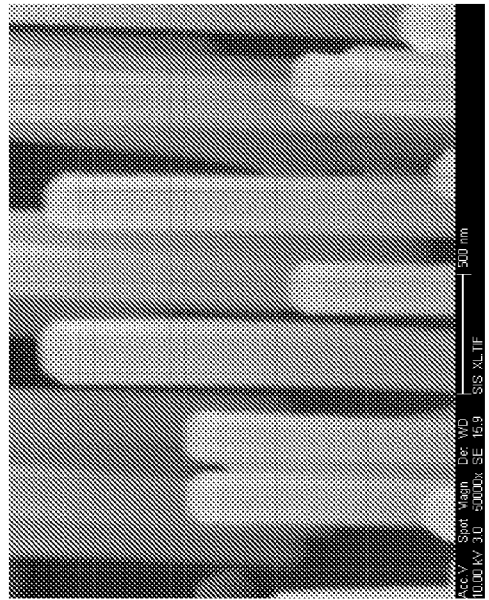
Figure 2E:
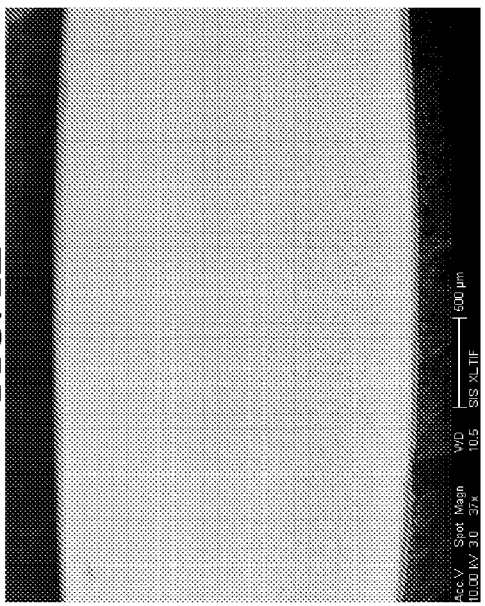
Figure 2G:
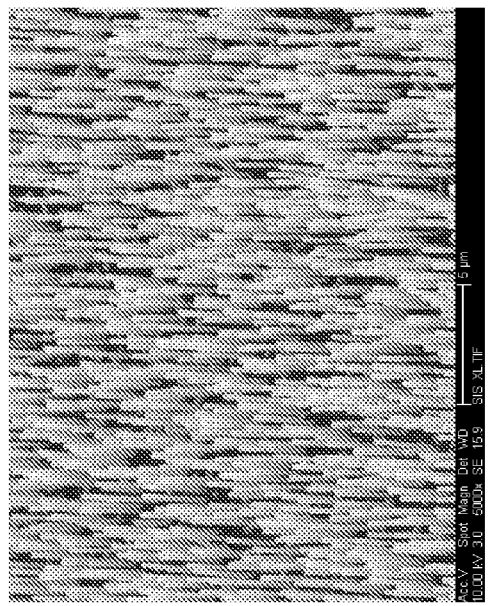

Embodiments of the invention have been demonstrated in experiments for vertical epitaxial growth of InAs nanowires on Si (111) substrate. The experiments demonstrated that the invention can be generally implemented for III-V semiconductors on oriented Si wafers. FIGS. 2A-2B are SEM images of InAs vertical semiconductor nanowires of the invention formed according to the preferred example method. If substantial re-oxidation is permitted prior to the formation of the nanowires, then non-vertical growth and islands occur, as shown in FIGS. 2C and 2D. In FIG. 2C InAs nanowires grown were formed after permitting on the re-oxidization of the substrate for 24 hours and in FIG. 2D for 130 hours. In the FIG. 2C example many non-vertical nanowires form and some islands are apparent. In FIG. 2D, almost all growth is non-vertical and many islands are apparent. Core/shell and core/multi shell nanowire structures were also formed with different alloy compositions in the core and shells. FIGS. 2E-H are SEM images of InAs/InGaAs/GaAs/InGaP core/multi-shell nanowires grown on silicon substrates.

In particular method used in the experiments, commercially available p-type Si (111) wafers were diced and cleaned. The substrate was etched using diluted Buffered Oxide Etch (BOE:$H_2O$=6:1) for 30 seconds to remove the native oxide followed by rinse in DI water for about 15 seconds and $N_2$ blow-drying. The samples were then loaded to a close-coupled showerhead type MOCVD system (Thomas Swan Scientific Equipment, Ltd.) using $AsH_3$ (arsine) and TMI (trimethyl-indium) precursors in $H_2$ carrier gas (total flow rate of 20 liters/min) at 100 Torr chamber pressure. The substrates were heated up and stabilized at the growth temperature of about 400-650° C. The growth was initiated by simultaneous introduction of $AsH_3$ and TMI to the reactor chamber with molar fraction of $2\times10^{-4}$ and $2\times10^{-6}$, respectively, via a close-coupled type shower head that introduces the precursors separately and uniformly over the deposition area. The growth time was for 5 minutes and the reactor was cooled down to 250° C. in $AsH_3$ flow to suppress potential decomposition of the InAs nanowires. Transmission Electron Microscopy (TEM) images of the InAs nanowires showed nanowires that were very uniform in diameter with a lot of striped contrasts, which are caused by the twin planes and stacking faults. The electron diffraction patterns revealed that the nanowires are zinc blende single crystal structure and the growth is along a <111> direction normal to the Si (111) substrate. The zinc blende structure with twins and stacking faults is all over the nanowire as well as the tip. No group III metal droplet was observed on the nanowire tip, in contrast to the self-catalyzed growth of GaAs nanowires as described in Jabeen, F.; Grillo, V.; Rubini, S.; and Martelli, F., "Self-Catalyzed Growth of GaAs Nanowires on Cleaved Si by Molecular Beam Epitaxy. Nanotechnology, 2008. 19(27): p. 275711.

The uniform morphology and crystal structure of the InAs nanowires is similar to that grown using the organic coating and selective area method. However, we believe that, despite the difference in the nucleation step, the nanowires, once nucleated, grow preferentially on <111> direction due to the growth on lateral <110> directions are inhibited. No large base islands were found at the area surrounding the nanowire root, which is clearly different from that typically found at the base of nanowires grown with Au catalysts. The growth nucleation mechanism is not entirely clear at this point, however, we believe most likely it is due to formation of self-assembled InAs islands, confined by the non-uniform oxide surface on Si, which nucleate nanowire growth from the clean Si surface. Native oxide can quickly reform during the handling and transfer of wafer to the growth chamber after etching process. The uniformity of nanowires and the absence of the catalyst particles on the tips suggest a catalyst free growth mechanism, since the diminishment and eventually disappearance of the catalysts will result in tapered nanowires with sharp tips. Besides simplifying the fabrication process, catalyst-free nanowire synthesis should also benefit device performance since Au, a catalyst most commonly used for nanowire growth, is known to incorporate into nanowires during growth and cause deep level traps in semiconductors.

In the experiments, the InAs nanowires grow vertically with a high density on substrates etched for more than 30 s, and islands and non-vertical growth are very rarely seen over a very large area, as seen in FIGS. 2A and 2B, which is a representative high magnification SEM image of the nanowires, revealing straight and uniform in diameter nanowires with a clear base and no measurable tapering. The nanowires have a hexagonal cross-section. The majority of InAs nanowires have a diameter around 40 nm, but other sizes were observed in the range of 30 to 80 nm.

Nanowire growth on the substrates with different amounts of re-growth of native oxide after etching was studied. In these experiments, the silicon substrates were etched and exposed to humid air (~85% relative humidity) for 1 hour, 12 hours, 24 hours, and 130 hours, respectively. From the experiments, it is evident that islands and non-vertical nanowires grow on substrates that are exposed to air for longer than 1 hour. The island and non-vertical nanowire growth on the substrates continues to increase with increasing re-oxidation time. As seen in FIG. 2C, non-vertical growth and island formation is substantial after 24 hours and the majority of nanowires are non-vertical after 130 hours (FIG. 2D). Similarly, substrates etched for less than 30 s exhibit non-vertical nanowrNo nanowire growth occurred on Si substrates that were not etched.

Photoelectrochemical Cell

Figure 3:
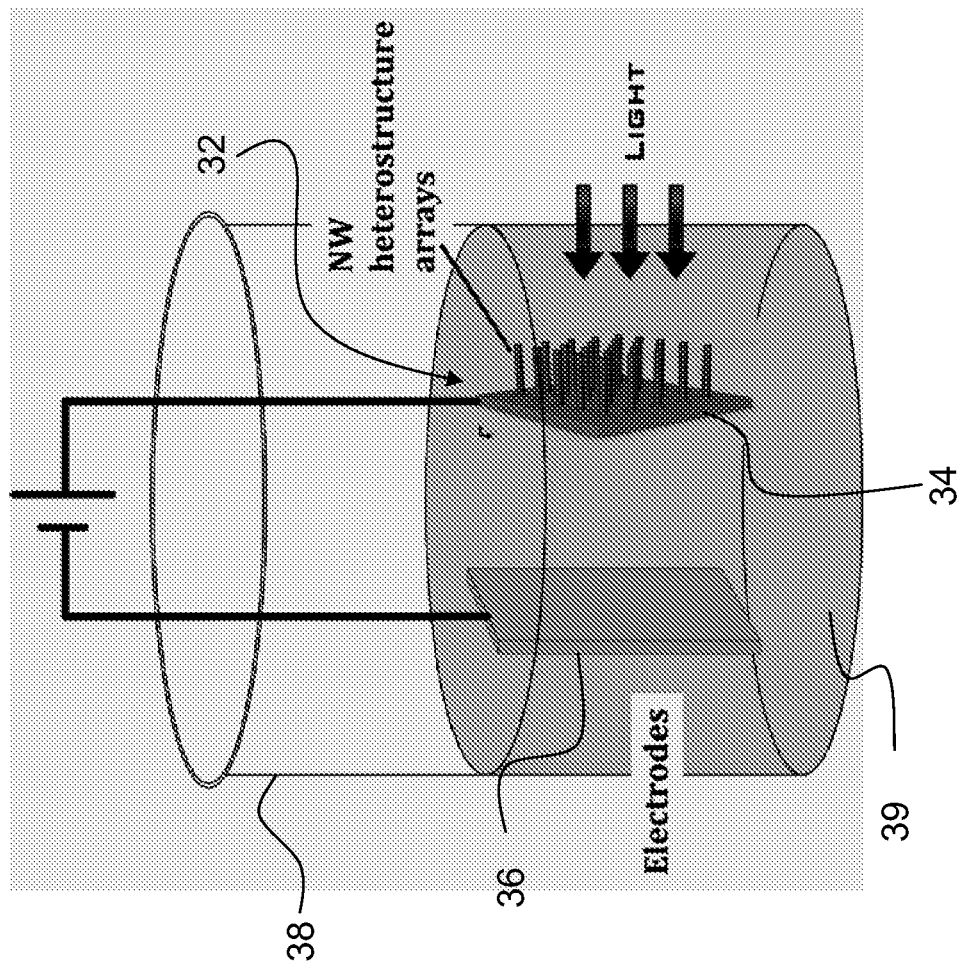
FIG. 3 is a schematic diagram of a preferred embodiment photoelectrochemical cell.

FIG. 3 shows an example embodiment photoelectrochemical cell of the invention. Arrays 32 of vertical nanowire structures directly formed on silicon 34 are driven by absorbed light with respect to a counter electrode 36 in a tank, container or cell 38 of water 39. The photoelectrochemical cell of FIG. 3 can directly dissociate water into hydrogen and oxygen. The nanowire arrays allows improved light absorption efficiency, reduced angular dependence, improved electron/hole separation efficiency, separated electron and hole pathway for collection to provide increased charge collection efficiency compared to planar designs.

Experimental Photovoltaic Cell

Figure 4:
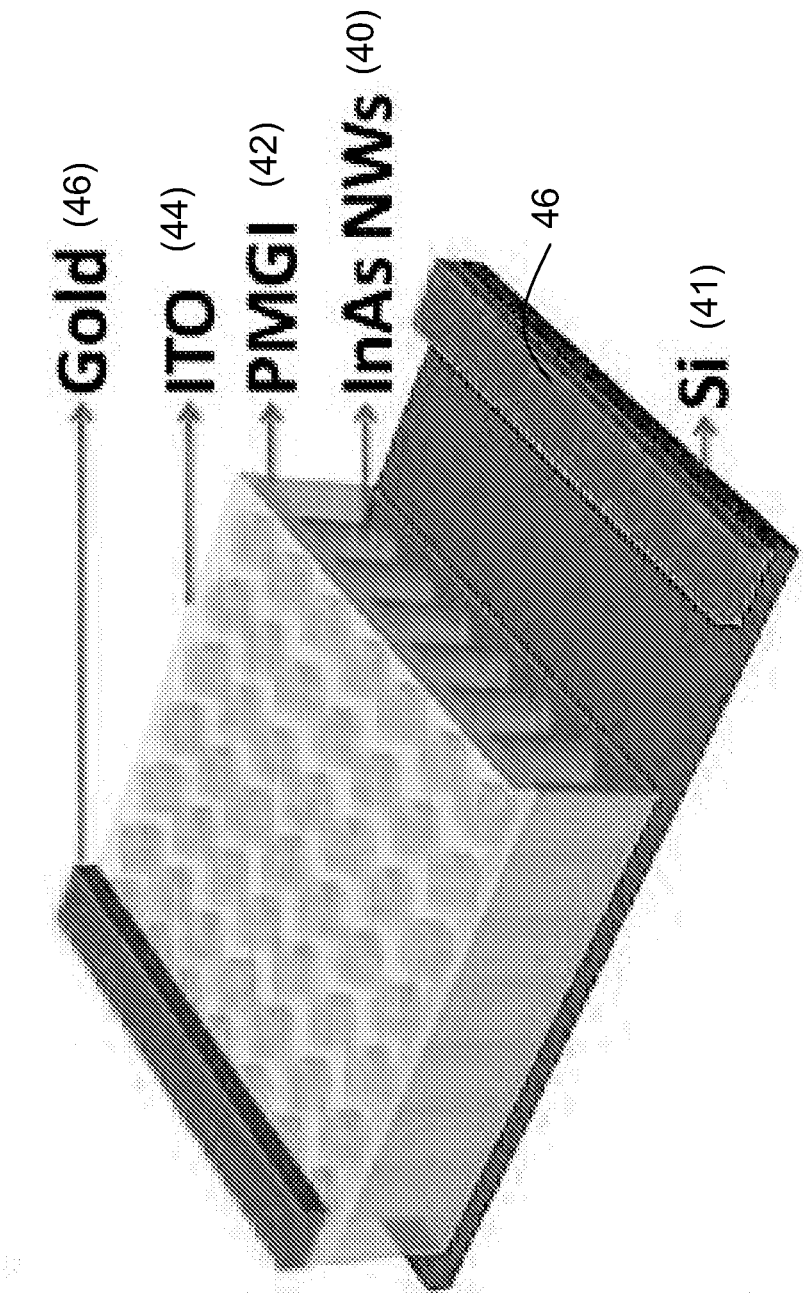
FIG. 4 is a schematic diagram of an experimental photovoltaic cell in which InAs nanowires formed directly on a silicon substrate were embedded in a polymer.

Experiments have demonstrated a solar cell and broad band photodetection. FIG. 4 shows a an experimental structure with InAs nanowires 40 grown on a silicon substrate 41 as described above were embedded in 600 a nm thick polymethylglutarimide (PMGI, Microchem) 42 insulating layer, and 110 nm thick indium tin oxide (ITO) 44 was deposited as a top contact to the InAs nanowires. Gold electrodes 46 were deposited at the edge of the top ITO pad and on the bottom Si substrate to ensure a good electrical contact. PMGI and ITO are nearly transparent to visible and near infrared light, allowing a significant amount of the optical excitation to reach the junction region at the nanowires/substrate interface. While not shown or tested, anti-reflection coatings on the ITO 44 should help to increase efficiency.

The heterojunctions formed at the interface between the n-type InAs nanowires and the p-type Si substrate were exploited to fabricate vertical array photodiode devices which showed an excellent rectification ratio and low reverse leakage current. Temperature-dependent current transport across the heterojunctions were studied theoretically and experimentally in the dark and under AM 1.5 illumination. When operated in photovoltaic mode, the open-circuit voltage was found to increase linearly with decreasing temperature while the energy conversion efficiency changed nonmonotonically with a maximum of 2.5% at 110 K. Modeling of the nanowire/substrate heterojunctions showed good agreement with the experimental observations, and allowed determining the conduction band offset between the InAs nanowires and Si to be 0.10-0.15 eV.

Current-voltage (I-V) characteristics were tested at various temperatures in a liquid nitrogen cryostat by a current-voltage sourcemeter (Keithley 2410). A rectification ratio greater than 104 at ±0.5 V bias and low reverse leakage current (~10-8 A) were achieved at room temperature, implying a high quality p-n junction between the n-type InAs nanowires and p-type Si substrate. A diode ideality factor about 2.4 was extracted from measured I-V data.

To further understand the current transport properties of this heterojunction, temperature dependent I-V curves were measured in dark and under illumination with air mass 1.5 (AM 1.5) spectrum. Data showed that at room temperature, the photocurrent at reverse bias is nearly 103 times larger than the dark current, even at a relatively small incident power intensity of 2.86 mW/cm$^2$, indicating a very strong photo response to white light. The saturated photocurrent at reverse bias is temperature independent while, at forward bias, the series resistance leads to an almost linear photocurrent increase with voltage in the higher voltage region. Unlike conventional p-n junctions, the dark current at forward bias shows only one linear portion, instead of two, when plotted on a semi-logarithmic scale, presumably due to the dominating holes current transport of the heterojunction.

The open circuit voltage Voc increases when temperature is reduced, and at the same time the short circuit current (Isc) decreases due to the reduction of thermally generated carriers. The Voc decreases linearly with increasing temperature, a behavior that is expected for p-n homojunction photodiodes, and that has also been previously reported for heterojunction photodiodes. The slope of Voc vs. temperature and intercept with the ordinate axis Voc are directly related to the incident light intensity and the band diagram of the heterojunction, respectively.

Independent measurements of the photovoltaic heterojunction at room temperature and under standard AM 1.5 conditions (I=100 mW/cm$^2$) have yielded energy conversion efficiency ECE~0.76%, which is consistent with an energy conversion efficiency of ECE~0.73% obtained at room temperature but at a lower illumination intensity (2.86 mW/cm2) inside the cryostat. Interestingly, when the temperature is reduced, the ECE increases at first, reaches a maximum of 2.5% at around T=110 K, and then slightly drops down by further lowering the temperature. The initial increase of the efficiency correlates with the increase of Voc with decreasing temperature, while its decrease at low temperature may be attributed to the poorer fill factor caused by an increase in series resistance. The ECE of the photodiode can be improved by increasing the physical fill factor of the InAs nanowires and decreasing the series resistance. Additionally, the photosensitivity to infrared light could be further enhanced by using more infrared-transparent electrodes, such as carbon nanotube networks, instead of ITO.

It is known that the Voc of a photodiode is limited by the built-in potential of the junction (Vbi). For the n-InAs/p-Si heterojunction photodiode, Voc reached 0.8 V at 83 K indicating a large built-in potential, therefore a relatively large valence band offset, $\Delta Ev$ (Eg2+$\Delta Ev$>qVbi), and a small conduction band offset, $\Delta Ec$ (Eg1-$\Delta Ec$>qVbi). Note that in the nanowire case, the presence of 10 surface states, strain and possibly stacking faults near the junction may considerably change the band discontinuity compared to the bulk case. Six current components are possibly generated across the heterojunction under forward bias, due to electron photocurrent (I1), hole emission current (I2), hole current due to interface recombination (I3), hole photocurrent (I4), electron diffusion current (I5), and electron current due to interface recombination (I6), and the electron-hole recombination at the interface. The overall current of the device under illumination can be obtained by analyzing the six components and calculating the net current across the junction. Among the current components, I1, I2, I3 and I6 are the most relevant. Under white light illumination, I4 is relatively small due to the large valence band offset, smaller depletion region and much minority carrier diffusion length in heavily doped InAs nanowire compared with p-Si. Only the holes with the sufficient energy (hot holes) contribute to I4, the rest are blocked at the heterogeneous interface and recombine with the photo-generated electrons from Si. I5 is negligible compared to I2 because the electron diffusion velocity is much smaller than the hole thermionic emission velocity in p-Si.

The magnitude of the recombination current is dominated by the number of holes that reach the heterointerface via valence band in Si as well as the density of interface states. Due to the nature of recombination, hole current I3 must equal to the electron current I6 here. Therefore the total current across the heterojunction can be assumed to be:

$$I = I_{dark} - I_{ph} \tag{1}$$

where Idark=I2+I3 represents the dark current and Iph is the photocurrent, which is given by:

$$I_{ph} = I_1 + I_4 - I_{rec} = qG_1(A_1 - A_2)(X_1 + L_{n1}) + qG_2 A_2 (X_2 + L_{p2}) - I_{rec} \tag{2}$$

where q is the elementary charge, G1, X1, Ln1 and G2, X2, Lp2 are the net photogeneration recombination rate per unit volume, length of depletion region and minority carrier diffusion length in p-Si and in n-InAs nanowires, respectively. A1 is the sum of all the cross-sectional areas of the depletion cylinders in Si, while A2 is the sum of all the nanowire cross-section areas (the active junction area of the device). Irec is due to the interface recombination of photogenerated electrons from Si and photogenerated holes from InAs caused by the large valence band offset. Because the Fermi level is very close to the conduction band edge of InAs, we have EF−Ev1+qVbi≈Eg2+ΔEv=Eg1−ΔEc, where EF−Ev1, if not specifically coordinated, indicates the difference between the Fermi level and the valence band edge in p-Si bulk region beyond the depletion region at equilibrium. Because of the large potential barrier in the valence band, the conduction mechanism for hole current I2 is governed by thermionic emission of holes in p-Si. The current density is therefore given by:

$$I_2 = qp_{10}A_2\sqrt{\frac{kT}{2\pi m_1^*}}\exp\left(-\frac{qV_{bi}}{kT}\right)\left[\exp\left(\frac{qV}{kT}\right)-1\right] = \qquad(3)$$

$$qA_2\sqrt{\frac{kT}{2\pi m_1^*}}N_{v1}\exp\left(-\frac{E_{g1}-\Delta E_c}{kT}\right)\left[\exp\left(\frac{qV}{kT}\right)-1\right]$$

where Nv1 is the effective density of states in valence band of p-Si, $p_{10}=N_{v1}\exp[(E_{v1}-E_F)/kT]$ is the hole concentration in bulk p-Si region beyond the depletion region at equilibrium, m1* is the effective mass of holes, k is the Boltzmann's constant, and V is the applied voltage. The interface recombination current I3 is given by the relation:

$$I_3 = qA_2S_{int}N_{v1}\exp\left(-\frac{E_{g1}-\Delta E_c}{kT}\right)\left[\exp\left(\frac{qV}{kT}\right)-1\right] \qquad(4)$$

in which Sint is the recombination velocity at the interface, a factor that involves the density of interface states and capture cross-section, and is believed to be relatively small in the experimental device due to the high quality abrupt nanowire/substrate heterojunctions which are nearly free from interface states. Substituting Eqs. (2), (3) and (4) into Eq. (1), yield the following current-voltage relationship:

$$I = qA_2N_{v1}\left[\left(\frac{kT}{2\pi m_1^*}\right)^{1/2}+S_{int}\right]\exp\left(-\frac{E_{g1}-\Delta E_c}{kT}\right)\left[\exp\left(\frac{qV}{kT}\right)-1\right]-I_{ph} \qquad(5)$$

By considering the series resistance and the ideality factor, this expression falls into the generic form proposed by Boer and Rothwalf for photovoltaic cells, in which the I-V characteristic is explained as a diode characteristic shifted by the photo-generated current $I=I_0\langle\exp[q(V-IR_s)/\gamma kT]-1\rangle -I_{ph}$, where Rs is the series resistance of the system, γ the ideality factor of the diode, and $$I_0=qA_2N_{v1}[kT/2\pi m_{m1}^*]^{1/2}+S_{int}]\exp[(-E_{g1}-\Delta E_c)/kT]=I_{00}\exp[(-E_{g1}-\Delta E_c)/kT]$$

For conventional p-n diodes, the dark current plotted versus voltage in semi-logarithmic scale typically shows two linear portions: the first, characterized by a smaller slope, appears in the low voltage regime and is predominantly related to carrier recombination, while the second, with relatively larger slope, is related to carrier diffusion. The observation of a single linear portion in the present device, however, is a clear indication that only one type of carriers (holes) dominates the current transport of the heterojunction in dark. This supports the assumption that I5 <<I2 due to the lack of electrons diffusing into the depletion region and therein recombining with holes. The functional dependence of Voc on temperature can be obtained by setting Eq. (5) to be zero:

$$qV_{oc}=E_{g1}-\Delta E_c+kT\ln(I_{ph}/I_{00}) \qquad(6)$$

For simplicity, neglect the mild temperature dependence of Eg1 and $\ln(I_{ph}/I_{00})$, Thus eq. (6) predicts a negative linear dependence of the open-circuit voltage on temperature, which is consistent with experimental results. The value of (Eg1−ΔEc) can be estimated by extrapolating qVoc versus T to T=0 K as the intercept with the ordinate axis. Assuming the bandgap of Si at T=0 K as 1.17 eV, the ΔEc of the heterojunction can be estimated to be ~0.10-0.15 eV. As previously mentioned, in the case of nanowires, this value is significantly lower than the conduction band offset predicted by the Anderson model for bulk InAs/Si heterojunction (ΔEc=0.85 eV). It is important to note that the conduction bandgap offset ΔEc is directly related to fundamental material properties and is assumed to be independent of the light intensity, bias voltage and the device fabrication process. This assumption is consistent with the fact that the two sets of data from different devices tested under different incident light intensity have similar intercepts at T=0 K. Eq. (6) also predicts that the slope of Voc versus T increases at higher irradiance (for higher Iph), as observed experimentally.

The photocurrent spectrum of the p-Si/n-InAs heterojunction photodiode was obtained using the conventional modulation technique, where light emitted by a halogen lamp was dispersed by a monochromator (Horiba Jobin Yvon iHR-550), modulated at a frequency of 134 Hz by a mechanical chopper (EG&G-PAR 197), and focused onto the sample; the photocurrent was measured by a lock-in amplifier (Stanford Research SR520) without bias and was corrected by the spectral intensity of light excitation. Below the Si absorption edge (λ>1,200 nm), only the InAs nanowires contribute to the photocurrent (I4), while above the Si absorption edge, both Si and InAs give their contribution (I1 and I4). The photocurrent spectrum showed a minimum at around 1,200 nm, corresponding to the absorption edge of silicon. This is not fully understood, which may be attributed to the nearly depletion of carriers due to recombination when the concentration of carriers photogenerated in Si is comparable to that in InAs nanowires (I1≈Irec). Direct integration of multiple band gap absorber materials as in the present example InAs/Si heterojunction allows harvesting solar energy from the wide solar spectrum which, combined with the enhanced light absorption offered by nanowire arrays, should provide increased energy conversion efficiency of photovoltaic cells. The sensitivity to both visible and infrared light should also enable this photodiode to be used as a multispectral photodetector to detect either visible or infrared light, which more importantly, open up the opportunities for integration to CMOS technology for broadband photosensing.

Vertical Surround Gate FET Transistor

Figure 5A:
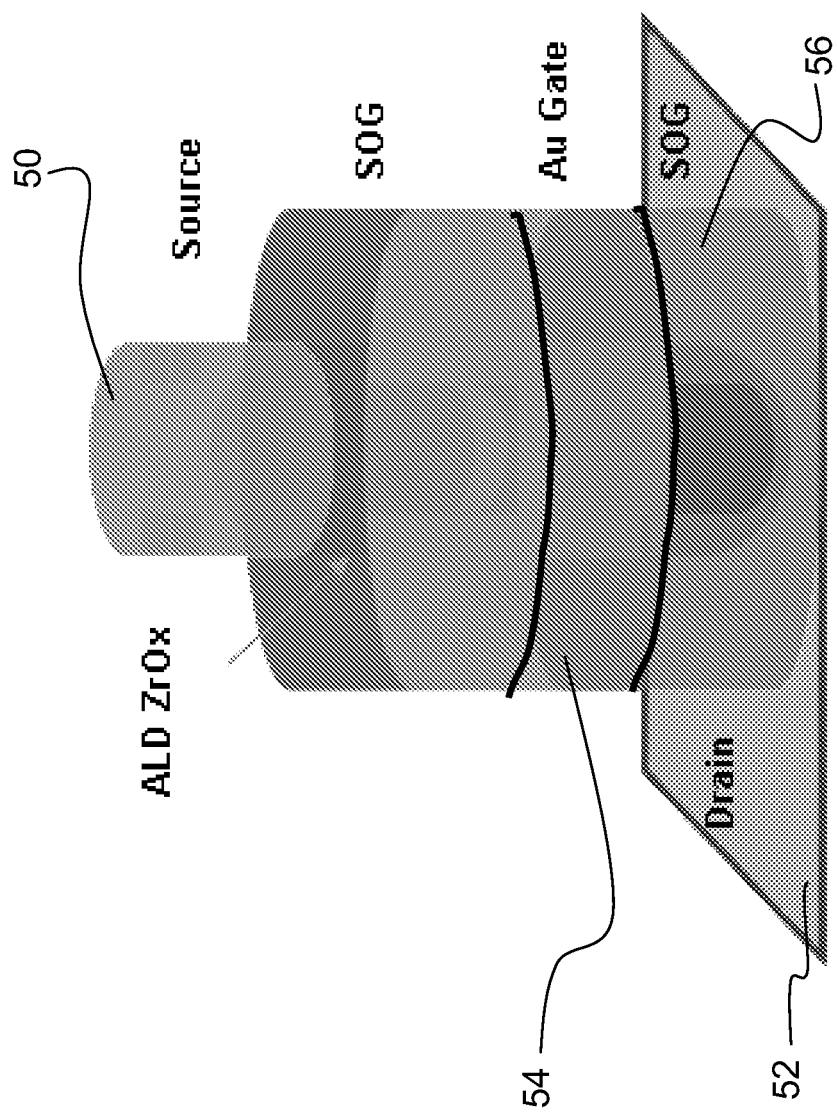
FIG. 5A is a schematic diagram of an example embodiment vertical FET transistor with a surrounding gate and gate oxide structure.
Figure 5B:
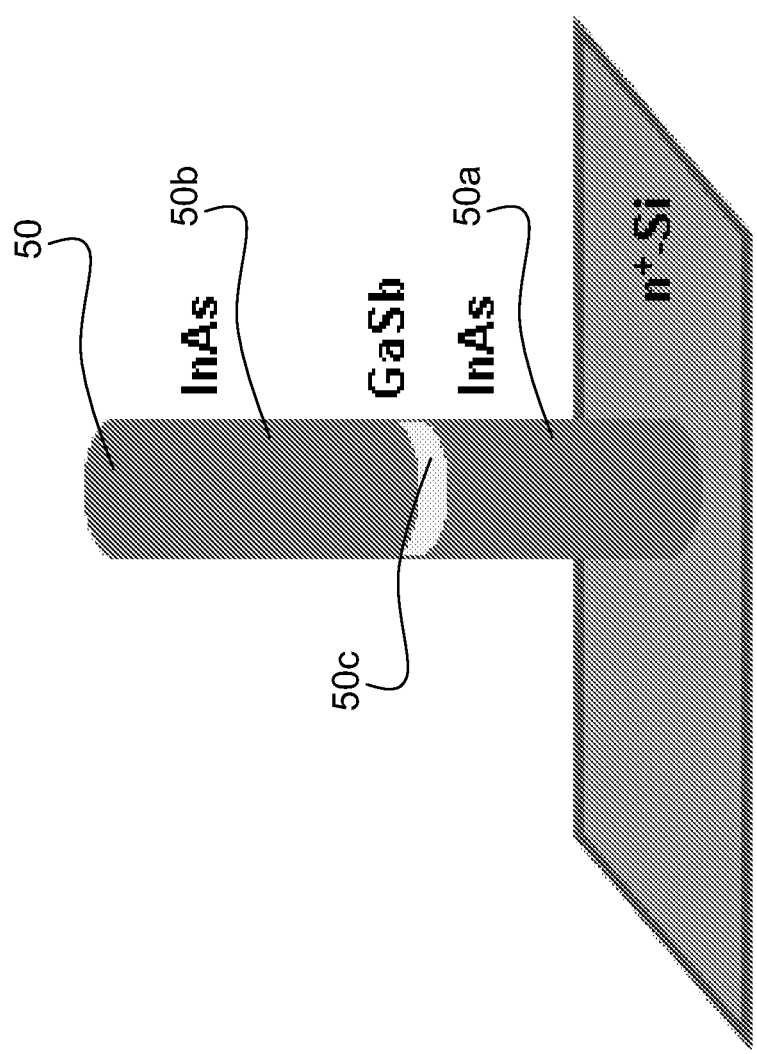
FIG. 5B shows an axial segmented core that can be used to form a tunneling transistor.
Figure 5C:
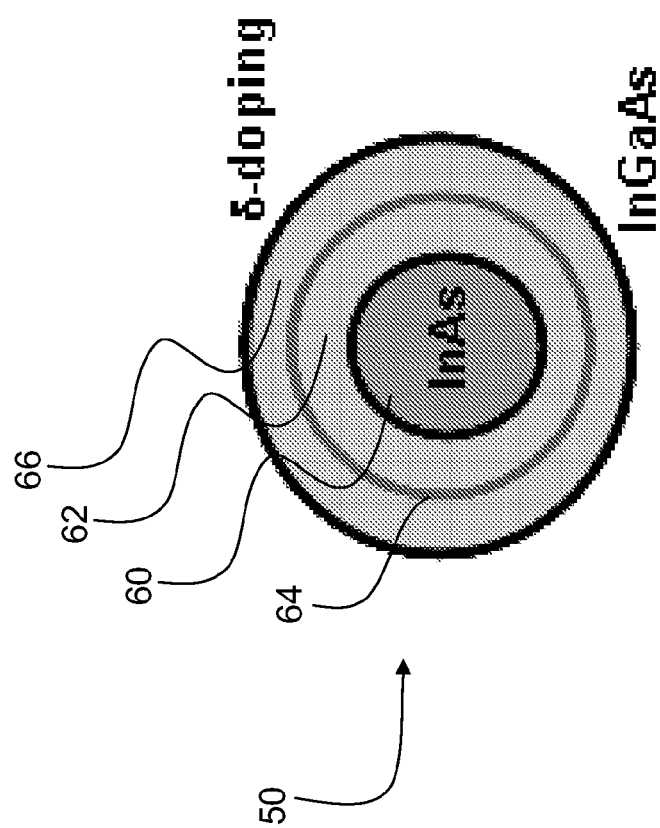
FIG. 5C shows another core that can be used in a high electron mobility transistor with the basic structure of FIG. 5A.

FIG. 5A is a schematic diagram of an example embodiment vertical transistor with a surrounding gate and gate oxide structure. A vertical nanowire, such as a core/shell nanowire 50 forms a source. The shell can be an insulating layer to isolate the source from the gate. In this example, the shell is an insulating layer of $ZrO_x$ formed by atomic layer deposition after growth of the nanowire core. A silicon substrate 52 forms a drain. A gate, such as a gold layer 54 is formed on first surrounding gate oxide (such as silicon dioxide) 56. A second gate oxide layer 58 is formed on the gate 54. Contact can be made separately via different levels of circuit interconnect patterns to the gate, source and drain. A tunneling transistor can be formed by introducing segmentation in the nanowire core. For example, in the area of the gate, the nanowire core can have a thin GaSb layer, where the nanowire core is InAs. Such a segmented core is shown in FIG. 5B. The core 50 includes primary InAs segments 50a and 50b and a GaSb segment 50c that serves as a tunneling barrier. FIG. 5C shows another core that can be used in a high electron mobility transistor with the basic structure of FIG. 5A. In FIG. 5C a core 60 is InAs surrounded by a layer of intrinsic InGaAs 62 and a thin heavily δ doped InGaAs layer 64. A final layer is another intrinsic InGaAs layer 66.

Vertical FET Transistor Array Integration to CMOS

Figures 6A, 6B:
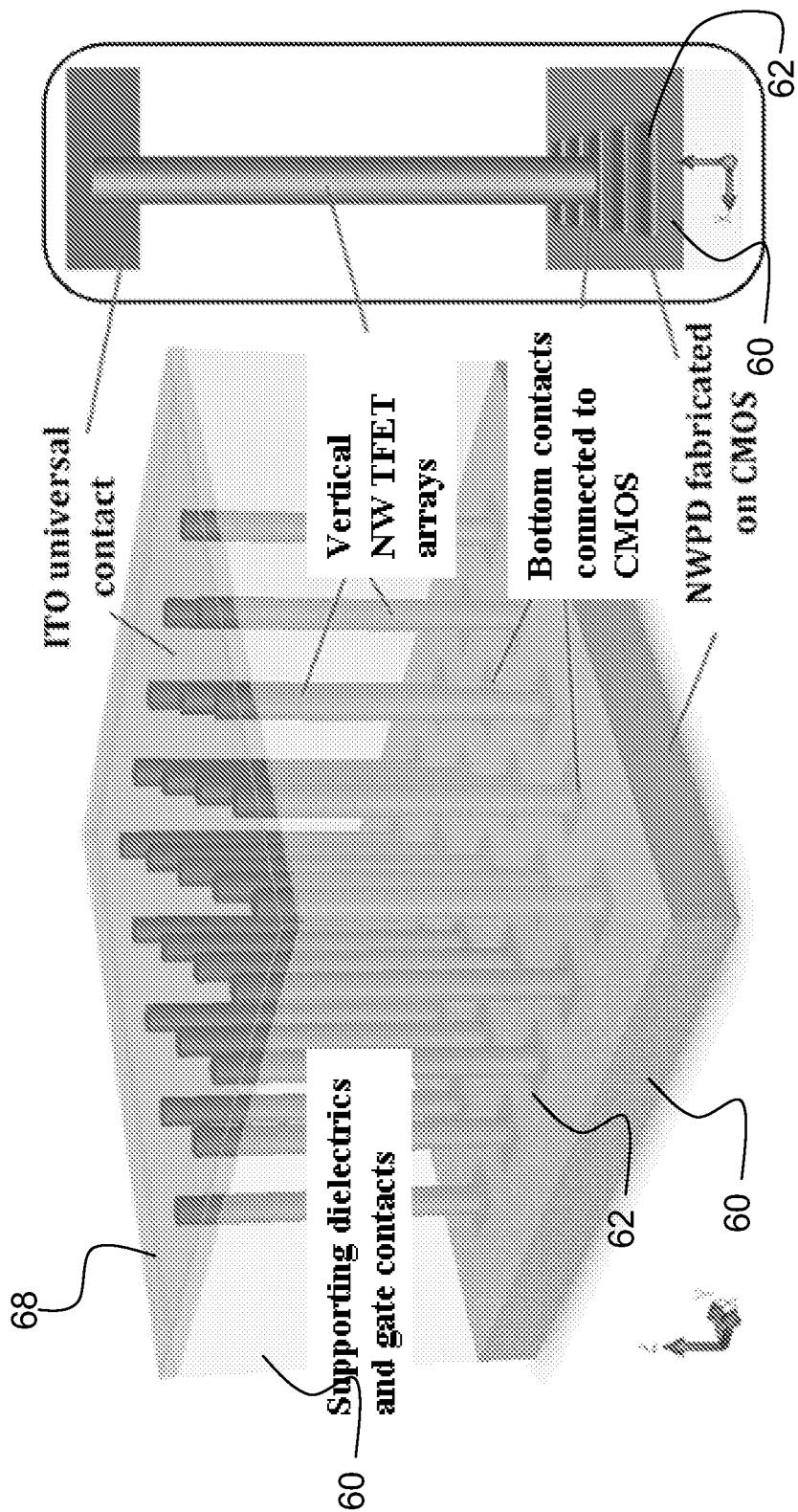
FIGS. 6A and 6B are a schematic diagrams of an example embodiment vertical transistor array integration to CMOS based upon vertical nanowire FETs such as shown in FIGS. 5A-5C.

FIGS. 6A and 6B are schematic diagrams of an example embodiment vertical transistor array integration to CMOS based upon vertical nanowire FETs such as shown in FIGS. 5A-5C. A silicon substrate 60 includes a CMOS integration contacts 62 and device structures (not illustrated but formed conventionally in silicon). Oxide and gate contact layers 66 are formed vertically around nanowires 68 as in FIG. 5A (but represented without detail in FIGS. 6A and 6B. A top contact layer 68 is a transparent contact, e.g. an indium tin oxide layer.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for direct heteroepitaxial growth of vertical III-V arsenide, phosphide or nitride semiconductor nanowires on a silicon substrate having a native oxide, the method comprising:
   treating the silicon substrate to remove the native oxide, and promptly handling and placing the silicon substrate into a reaction chamber after said treating and without any pre-deposited material on a surface of the silicon substrate but with some native oxide reformation to create a non-uniform native oxide on the silicon substrate;
   heating the silicon substrate without any pre-deposited material and with the non-uniform native oxide on its surface and having it reach thermal equilibrium at a growth temperature after a stabilization time;
   providing Group III-V precursors of the arsenide, phosphide or nitride into the reaction chamber having the silicon substrate without any pre-deposited material but with some native oxide reformation to create the non-uniform native oxide on the surface to establish a total flow rate of the Group III-V arsenide, phosphide or nitride precursors and allow self-assembled Group III-V arsenide, phosphide or nitride islands to nucleate confined by the non-uniform native oxide, each with a chosen molar fraction; and
   allowing growth of the vertical III-V arsenide, phosphide or nitride semiconductor nanowires to continue for a growth time.

2. The method of claim 1, further comprising:
   terminating the flow of the Group III precursor after the growth time; and
   retaining the flow of the element V precursor of the arsenide, phosphide or nitride until the reaction chamber cools down.

3. The method of claim 1, wherein the Group III-V precursors of the arsenide, phosphide or nitride are introduced via carrier gas into the reactor chamber and the reactor is held at a constant chamber pressure.

4. The method of claim 1, wherein the Group III-V precursors of the arsenide, phosphide or nitride are InAs precursors and the growth temperature is about 400-650° C.

5. The method of claim 1, wherein said treating comprises etching for at least about 30 seconds.

6. The method of claim 4, wherein the silicon substrate is placed into the reaction chamber in about 1 hour or less after said treating.

7. The method of claim 1, wherein: the Group III-V precursors of the arsenide, phosphide or nitride are $AsH_3$ (arsine) and TMI (trimethyl-indium-$(CH_3)_3$In).

8. The method of claim 1, wherein the silicon substrate comprises a (111) oriented Si wafer.

9. The method of claim 1, wherein the reaction chamber comprises a showerhead proximate to the silicon substrate that vertically introduces the Group III-V precursors of the arsenide, phosphide or nitride precursors separately and uniformly through a plurality of ports over a deposition area on the silicon substrate.

10. The method of claim 1, wherein said treating comprises consecutively: etching using diluted Buffered Oxide Etch for about at least 30 seconds to remove the native oxide; rinsing in deionized (DI) water for about 15 seconds; and drying by $N_2$ blow-drying.

11. The method of claim 1, wherein the growth time is about 5 minutes and a cool-down temperature is about 250° C.

12. The method of claim 1, further comprising growing one or more shell layers around the vertical III-V arsenide, phosphide or nitride semiconductor nanowires.

13. The method of claim 12, further comprising in-situ doping during growth of the vertical III-V arsenide, phosphide or nitride semiconductor nanowires and/or growth of the one or more shell layers.

14. The method of claim 13, further comprising varying doping during growth of the vertical III-V arsenide, phosphide or nitride semiconductor nanowires to create one of an axial or radial homojunction or heterojunction.

15. The method of claim 12, further comprising varying alloy composition during growth of the vertical III-V arsenide, phosphide or nitride semiconductor nanowires to create one of an axial or radial homojunction or heterojunction.

16. A method for direct heteroepitaxial growth of vertical III-V arsenide, phosphide or nitride semiconductor nanowires on a silicon substrate having a native oxide, the method comprising:
   etching the silicon substrate to remove the native oxide;
   promptly placing the silicon substrate in a reaction chamber after said etching and without any pre-deposited material on a surface of the silicon substrate but with some native oxide reformation to create a non-uniform native oxide on the silicon substrate;
   raising the temperature of the substrate without any pre-deposited material on the surface to a III-V arsenide, phosphide or nitride growth temperature;
   introducing Group III-V precursors of the arsenide, phosphide or nitride for a growth time to form the vertical III-V arsenide, phosphide or nitride semiconductor nanowires on the surface of the silicon substrate without any pre-deposited material on the surface by allowing self-assembled Group III-V arsenide, phosphide or nitride islands to nucleate confined by the non-uniform native oxide and then continue to grow into the vertical III-V arsenide, phosphide or nitride semiconductor nanowires;

terminating the flow of the Group III precursor after the growth time; and retaining flow of the Group V precursors of the arsenide, phosphide or nitride during a cool down period.

17. The method of claim 16, further comprising growing one or more shell layers around the vertical III-V arsenide, phosphide or nitride semiconductor nanowires.

18. The method of claim 17, further comprising in-situ doping during growth of the vertical III-V arsenide, phosphide or nitride semiconductor nanowires and/or growth of the one or more shell layers.

19. A method for direct heteroepitaxial growth of vertical III-V arsenide, phosphide or nitride semiconductor nanowires on a silicon substrate having a native oxide, the method comprising:

etching a surface of the silicon substrate with a buffered oxide etcher to produce a hydrogen terminated clean surface on the silicon wafer;

rinsing the hydrogen terminated clean surface with de-ionized water;

drying the hydrogen terminated clean surface in nitrogen;

maintaining the clean surface and placing the silicon substrate with the hydrogen terminated clean surface promptly in a Metal-Organic Chemical Vapor Deposition (MOCVD) reactor, wherein the hydrogen terminated clean surface includes reformed non-uniform native oxide;

heating the silicon substrate with the hydrogen terminated clean surface to a Group III-V arsenide, phosphide or nitride growth temperature and maintaining the silicon substrate at the Group III-V arsenide, phosphide or nitride growth temperature;

introducing Group III-V precursors of the arsenide, phosphide or nitride separately into the MOCVD reactor over the clean surface via a showerhead port proximate the clean surface while maintaining a constant pressure in the MOCVD reactor and the silicon substrate at the Group III-V arsenide, phosphide or nitride growth temperature, and continuing the introduction for nucleation confined by the non-uniform native oxide and subsequent growth of vertical Group III-V arsenide, phosphide or nitride semiconductor nanowires for a period of a few seconds for the nucleation followed by growth time of the Group III-V arsenide, phosphide or nitride semiconductor nanowires up to about 5 minutes, wherein the showerhead port vertically introduces the Group III-V precursors of the arsenide, phosphide or nitride separately and uniformly through a plurality of ports over a deposition area on the silicon substrate.

20. The method of claim 19, wherein the silicon substrate comprises a p-type Si (111) wafer, said etching is conducted with HF for at least about 30 seconds and the silicon wafer is placed in the MOCVD reactor within an hour after the drying of the hydrogen terminated clean surface.

21. The method of claim 19, further comprising:

terminating the flow of the Group III precursor after the growth time; and retaining the flow of the Group V precursor of the arsenide, phosphide or nitride during a cool down period to cool the MOCVD reactor below the Group III-V arsenide, phosphide or nitride growth temperature.

22. The method of claim 21, wherein the Group V precursor of the arsenide, phosphide or nitride is maintained until the MOCVD reactor is cooled to about 250° C.

* * * * *